(12) United States Patent
Nakamura et al.

(10) Patent No.: US 7,152,331 B2
(45) Date of Patent: Dec. 26, 2006

(54) POSITIONING APPARATUS

(75) Inventors: Tsuyoshi Nakamura, Kanagawa (JP); Nobuhito Saji, Kanagawa (JP); Yoshifumi Sugita, Kanagawa (JP); Masato Taniguchi, Kangawa (JP)

(73) Assignee: NSK Ltd., Tokyo (JP)

( * ) Notice: Subject to any disclaimer, the term of this patent is extended or adjusted under 35 U.S.C. 154(b) by 0 days.

(21) Appl. No.: 10/761,330

(22) Filed: Jan. 22, 2004

(65) Prior Publication Data

US 2004/0177520 A1 Sep. 16, 2004

(30) Foreign Application Priority Data

Jan. 22, 2003 (JP) .......................... P.2003-013974

(51) Int. Cl.
*G01D 21/00* (2006.01)

(52) U.S. Cl. ......................................... 33/1 M; 33/573

(58) Field of Classification Search ................. 33/1 M, 33/568, 573
See application file for complete search history.

(56) References Cited

U.S. PATENT DOCUMENTS 3,918,167 A * 11/1975 Gerber ........................ 33/613
5,699,621 A * 12/1997 Trumper et al. .............. 33/1 M
5,701,677 A * 12/1997 Yamaguchi et al. .......... 33/1 M
5,806,193 A * 9/1998 Ebihara ....................... 33/1 M
5,888,268 A * 3/1999 Bando .......................... 33/1 M
6,157,157 A * 12/2000 Prentice et al. .............. 33/1 M
6,327,929 B1 * 12/2001 Yanagisawa ................. 33/1 M
6,347,458 B1 * 2/2002 Kaczynski .................... 33/503
6,434,840 B1 * 8/2002 Jourtchenko et al. ........ 33/1 M
6,609,304 B1 * 8/2003 Mishler ....................... 33/1 M
6,647,632 B1 * 11/2003 Tominaga et al. ........... 33/1 M
6,688,016 B1 * 2/2004 Suhara et al. ................. 33/613
6,817,104 B1 * 11/2004 Kaneko et al. .............. 33/1 M
6,839,970 B1 * 1/2005 Montesanti et al. ......... 33/1 M

FOREIGN PATENT DOCUMENTS

JP        2002-158274 A        5/2002

* cited by examiner

*Primary Examiner*—Yaritza Guadalupe-McCall
(74) *Attorney, Agent, or Firm*—Sughrue PLLC

(57) ABSTRACT

A positioning apparatus has a stage, guide elements provided on both ends of the stage, and drive elements which are provided at one of both ends of the stage and move the stage along the guide elements. Like linear guide rails 61A, 61B and linear guide bearings 23A, 23B, two guide elements are provided in an area where a ball screw shaft 52 serving as a drive element is placed. One guide element is provided in an area where a non-drive element is provided.

21 Claims, 6 Drawing Sheets

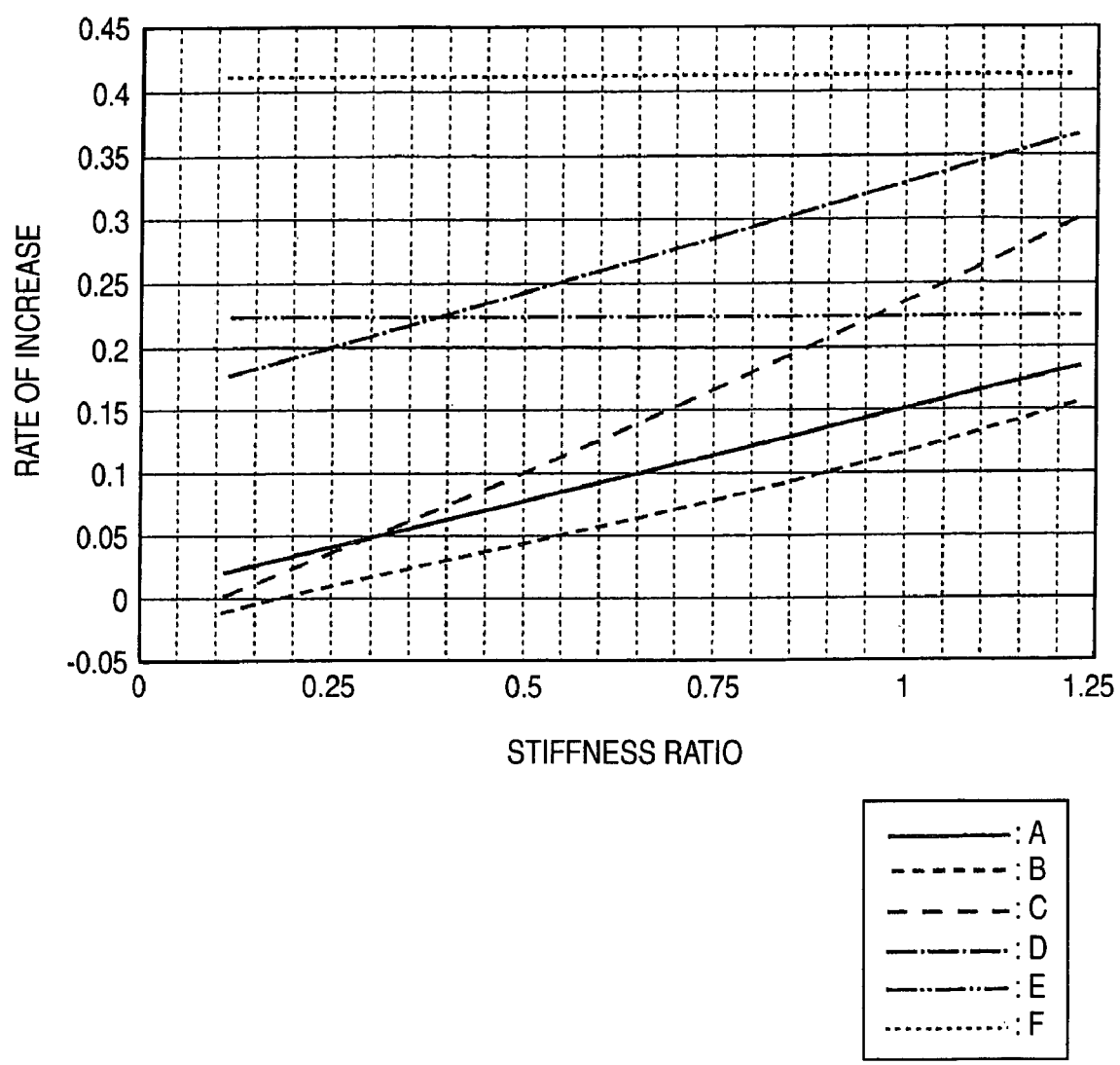

POSITIONING APPARATUS

BACKGROUND OF THE INVENTION

The present invention relates to a positioning apparatus for use with a semiconductor exposure system to be used for forming a pattern on a flat substrate, such as a semiconductor wafer or a liquid-crystal panel, as well as with an assembly/inspection apparatus and a precision machine tool.

[Patent Document 1] JP-A-2002-158274

A positioning apparatus described in, e.g., JP-A-2002-158274, is the positioning apparatus of this type. This patent publication discloses a positioning apparatus intended for providing a high-precision, long-life positioning apparatus which can actuate a slider at high speed and has achieved space saving. The positioning apparatus has a first positioning device for positioning a first slider (an intermediate stage) to a base in an X-axis direction by means of a first drive device; and a second positioning device for positioning a second slider (the intermediate stage) on the base in a Y-axis direction by means of a second drive device. The first and second drive devices are provided on the base, and the first and second sliders are arranged so as to overlap in a Z-axis direction. A stage is engaged with both the first and second sliders.

The stage of the positioning apparatus is characterized in that a fine movement shaft, a workpiece chuck, or a transfer mechanism, which are to be mounted on the stage, are arranged on a base-side of the stage (i.e., a lower side of the stage in the Z-axis direction) by way of a hole formed in the center of the stage. In order to prevent interference with these elements mounted on the stage, the through hole is formed in the respective intermediate stages. A drive element, such as a ball screw, and a guide element, such as a linear guide, are provided on an edge section of the intermediate stage instead of at the center thereof.

Since the through holes are formed in the above-described intermediate stages, there arises a problem of the intermediate stages having low stiffness; especially, insufficient stiffness in a yawing direction. In the meantime, the intermediate stages are supported by guide rails laid on the base, thereby enhancing the yawing stiffness of comparatively-intermediate stages. The hollow structure of the intermediate stages has originally suffered a problem of low horizontal stiffness of the entire intermediate stages, because the hollow structure deteriorates the stiffness of the intermediate stages acting as sheet materials. The problem is described more specifically as follows.

FIG. 2 is a schematic view showing the layout of linear guide rails 60A, 60B and a ball screw shaft 52 with respect to an intermediate stage 12. The intermediate stage 12 is movably supported on the linear guides and the ball screw shaft 52, by means of linear guide bearings (31A, 31B, 31E, and 31F) and a ball screw nut 52D.

In such a construction, the ball screw shaft 52 is disposed at a brim of the intermediate stage. Hence, the rotational center of the stage is located around the ball screw nut. The linear guides (constituted of the linear guide rail 60B and the linear guide bearings 31A, 31B) located close to the ball screw possess the force of constraint (i.e., the force of resistance to a screw) against vibrations in the yawing direction of the stage (i.e., the direction designated by the arrow in FIG. 2).

The stiffness of the intermediate stage 12 is low in an area thereof located opposite the area where the ball screw shaft 52 is located. For this reason, in response to vibrations in the intermediate stage 12 in the yawing direction, the linear guide bearings 31E, 31F constituting the linear guide in the opposite area are vibrated in an advancing direction. This is attributable to a low-stiffness portion (i.e., a hollow section) 24 (100) of the intermediate stage 12 becoming elastically deformed before the linear guide—which is located in the area opposite the area where the ball screw shaft is located—exhibits the original force of resistance against the vibrations arising in the yawing direction.

Specifically, the previously-described positioning apparatus has a hollow shape, and therefore the linear guide located in the area opposite the ball screw shaft 52 fails to exhibit stiffness in the yawing direction. Therefore, there is a drawback of the stiffness of the intermediate stages in the yawing direction being low. Hence, there is a problem of the inability to accurately position the stage.

SUMMARY OF THE INVENTION

In order to solve the drawback, the present invention aims at providing a positioning apparatus which is formed in, e.g., a hollow shape, and has mitigated the previously-described drawback in the stage having low stiffness in a yawing direction, by means of putting contrivance into a layout of guide elements or the like.

In order to achieve the object, the present invention provides a positioning apparatus characterized by comprising: a stage; guide elements provided on both ends of the stage; and drive elements which are provided at one of both ends of the stage and move the stage along the guide elements, wherein resistance to a moment in a yawing direction of the stage, that is, stiffness in a yawing direction of the stage of the guide elements provided on the same side where the drive elements are provided is made higher than that of the guide elements provided in an area opposite the area where the drive element is provided.

According to the invention, stiffness, in a yawing direction of the stage, of the guide elements provided on the same side where the drive elements are provided is made higher than that of the guide elements provided in an area opposite the area where the drive element is provided. As a result, vibrations of the drive element in the yawing direction of the stage are reliably restrained, thereby improving the yawing stiffness of an area of the stage opposite the area where the drive element is provided. Specifically, a vibratory eigenvalue of the stage in the yawing direction thereof can be increased.

Therefore, for instance, an additional guide element is provided in the same area of the stage where the drive element is provided. Preferably, a plurality of guide elements are provided in the same area of the stage where the drive element is provided so as to be symmetrical with respect to the drive element and mutually proximate to each other.

As will be described later, an examination performed by the present inventor shows that addition of another guide element in the area of the stage opposite the area where the drive element is provided is not effective, but addition of the same in the same area of the stage where the drive element is provided is effective. Addition of another guide element in the area where no drive element is provided is also conceivable. However, in such a case little effect is yielded. When the stage has low stiffness, the vibratory eigenvalue in the yawing direction can be increased by adding the guide element to only the same area of the stage where the drive element is provided.

Here, the drive element is a mechanical configuration for actuating the stage. For instance, the drive element is a ball screw mechanism such as that mentioned in connection with the related-art example. The guide element is a mechanical configuration for guiding movement of the stage; for instance, a linear guide mechanism.

A method for enhancing the yawing stiffness of the guide element provided in the area of the stage where the drive element is provided so as to become higher than that achieved in the area opposite the area where the drive element is provided is a configuration for adding a guide element as mentioned previously. However, the invention is not limited to such a configuration. There may be employed a method for making the linear guide large, a configuration for increasing an interval (or span L) between linear guide bearings when two linear guide bearings are provided, or a combination thereof. The number of guide elements to be disposed in the area where the drive element is provided is not limited to two.

The present invention is effective for a case where the stage has low stiffness. The stage to which the present invention is applied is not limited to the previously-described stage with open section and includes a stage whose yawing stiffness is reduced with a view toward reducing weight or the like. The present invention is also characterized by an X-Y stage having the previously-described positioning apparatus.

BRIEF DESCRIPTION OF THE DRAWINGS

FIG. 6 is a characteristic view for describing the yawing stiffnesses of the respective configurations shown in FIG. 5.

DETAILED DESCRIPTION OF THE PREFERRED EMBODIMENTS

Figure 1:
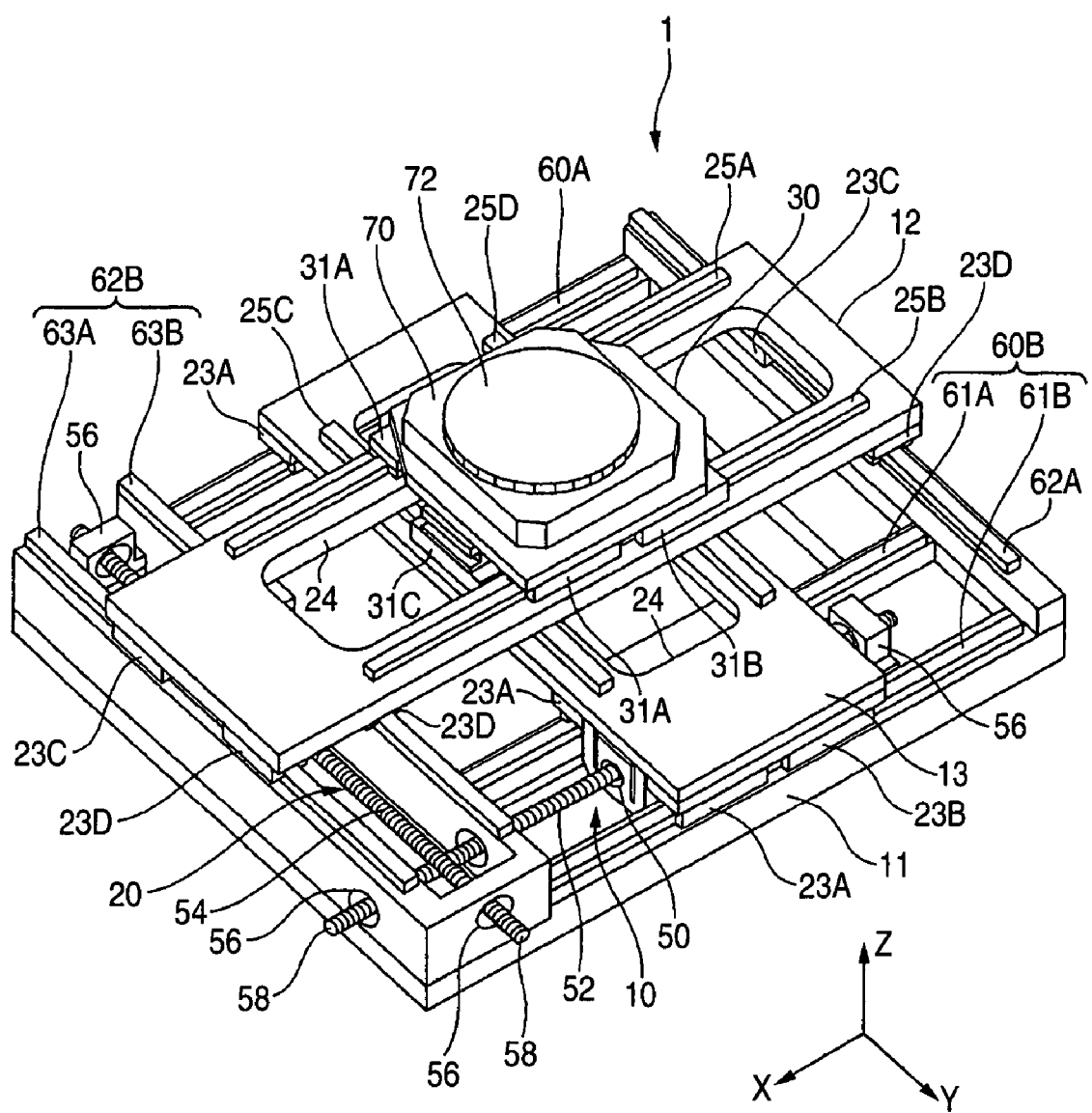
FIG. 1 is a perspective view of a positioning apparatus (i.e., an X-Y stage) according to the invention.

An embodiment of a positioning apparatus according to the present invention will now be described by reference to FIG. 1. The present embodiment is directed toward the positioning apparatus which is disposed in a vacuum chamber and comprises an X-Y stage capable of positioning an object of positioning in two dimensions. The positioning apparatus is suitable for use with, e.g., ion implantation or a beam exposure system. Those constituent elements which are the same as those described by reference to FIG. 2 are assigned the same reference numerals.

Reference numeral 1 designates the overall configuration of a positioning apparatus serving as an X-Y stage when viewed from an oblique direction thereof. The positioning apparatus 1 comprises a base 11; a first positioning mechanism 10 which is provided on the base 11 and positions a first slider 13 (an intermediate stage) in an X-axis direction (a first direction); a second positioning mechanism 20 which is placed on the base 11 and positions the second slider (an intermediate stage) 12 in a Y-axis direction (a second direction); and a stage 30 which is positioned in the X-axis and Y-axis directions by means of the first positioning mechanism 10 and the second positioning mechanism 20.

Each of the positioning mechanisms has a movement mechanism for moving the corresponding one of sliders (12, 13) in the X-axis or Y-axis direction with respect to the base 11. This movement mechanism has the ball screw serving as a drive element, and the linear guide serving as a guide element.

The ball screw is constructed as follows. The ball screw has a ball screw nut bracket 50 equipped with ball screw nuts fixed on lower surface (back surface in the drawing) of the corresponding slider (12 or 13), and a corresponding ball screw shaft (52 or 54) which is screw-engaged with the ball screw nut and axially moves the ball screw nut by means of rotation.

The neighborhoods of both ends of the respective X-axis and Y-axis ball screw shafts are supported by bearings 56 so as to make the ball screw shafts rotatable with respect to the base 11. A motor for rotating the ball screw shaft is connected to an extremity 58 of the ball screw shaft. The motor is mounted on, e.g., the base 11. Alternatively, although not specifically illustrated, the motor is mounted on a solid area, such as a floor or bed on which the base is to be installed. In the case of a motor designed for use in a vacuum, the motor may be mounted on the base 11 and arranged within a vacuum chamber. In the case of a motor for use in an atmosphere, the motor may be mounted outside the vacuum chamber. Further, a spindle of the motor may be caused to penetrate through the chamber, and the thus-penetrated section may be sealed. In any event, the motors of both the X-axis and Y-axis ball screw shafts are arranged to be stationary. As a result, coupled with the fact that movable sections, such as sliders, are formed from a non-magnetic material, the positioning apparatus can suppress variations in a magnetic field. The positioning apparatus is preferably used with an ion implantor, a beam exposure system, or the like.

The sliders (12, 13) each have substantially rectangular surfaces whose shorter sides are arranged in the axial direction. An opening section 24 is formed in substantially the center of the rectangular surface. Meanwhile, the linear guides are constituted in the following manner. Linear guide rails 60A, 60B are arranged in parallel in upper portions at both ends of the base along the X-axis direction of the base 11.

The linear guide rail 60B is provided on the part of the base 11 where the ball screw mechanism is provided. The linear guide rail 60A is provided on the end opposite that on which the ball screw mechanism is provided. The linear guide rail 60B is constituted of two guide rail sections 61A, 61B. The guide rail sections 61A, 61B are arranged on the base 11 so as to become closely parallel with each other with the ball screw shaft 52 interposed therebetween. Likewise, linear guide rails (sections) 62A, 62B (63A, 63B) are provided in the Y-axis direction of the base 11.

A set including X-axis linear guide bearings 23A, 23B— which slidably mesh with the linear guide rails (sections) 60A, 60B (61A, 61B)—is provided on each axial end on the lower surface of the X-axis slider 13 so as to face the respective linear guide rails. Reference numerals 23C, 23D designate linear guide bearings provided on the Y-axis slider 12 in the same manner as in the case of the X-axis slider.

A set including linear guide rails 25A, 25B is formed at each axial end on the upper surface of the Y-axis slider 12 for axially guiding the linear guide bearings 31A, 31B along the edge of the opening section 24. The X-axis slider is constituted in the same manner. Reference numerals 25C, 25D denote linear guide rails provided on the X-axis slider 13. Reference numeral 31C denotes a linear guide bearing which meshes with the linear guide rail 25C (a counterpart provided so as to mesh with the linear guide rail 25D is not shown). The slider 12 is placed above the first slider 13 in an overlapping manner so as avoid mutual interference in an upward direction; that is, a Z-axis direction (a direction orthogonal to the X-axis and Y-axis directions).

When the stage 30, which serves as a mechanism to be positioned, is positioned, the ball screw shafts of the respective axes are rotated by means of driving the motors of the respective shafts, thereby moving the ball screw nuts along the ball screw shafts. The stage 30 is moved in one or both of the X-axis and the Y-axis directions and stopped at a target position.

The stage 30 has a substantially square surface, and an opening section is formed in substantially the center thereof. Reference numeral 70 designates a micro-movement mechanism provided on the stage 30. Reference numeral 72 designates a work chuck on which an object of positioning is to be placed or which attracts the object. The micromovement mechanism 70 utilizes a configuration for minutely actuating the work chuck 72 in hexaxial directions (i.e., the X-axis, Y-axis, and Z-axis directions, and rotational directions about the respective axes) by means of a piezoelectric element.

Figure 2:
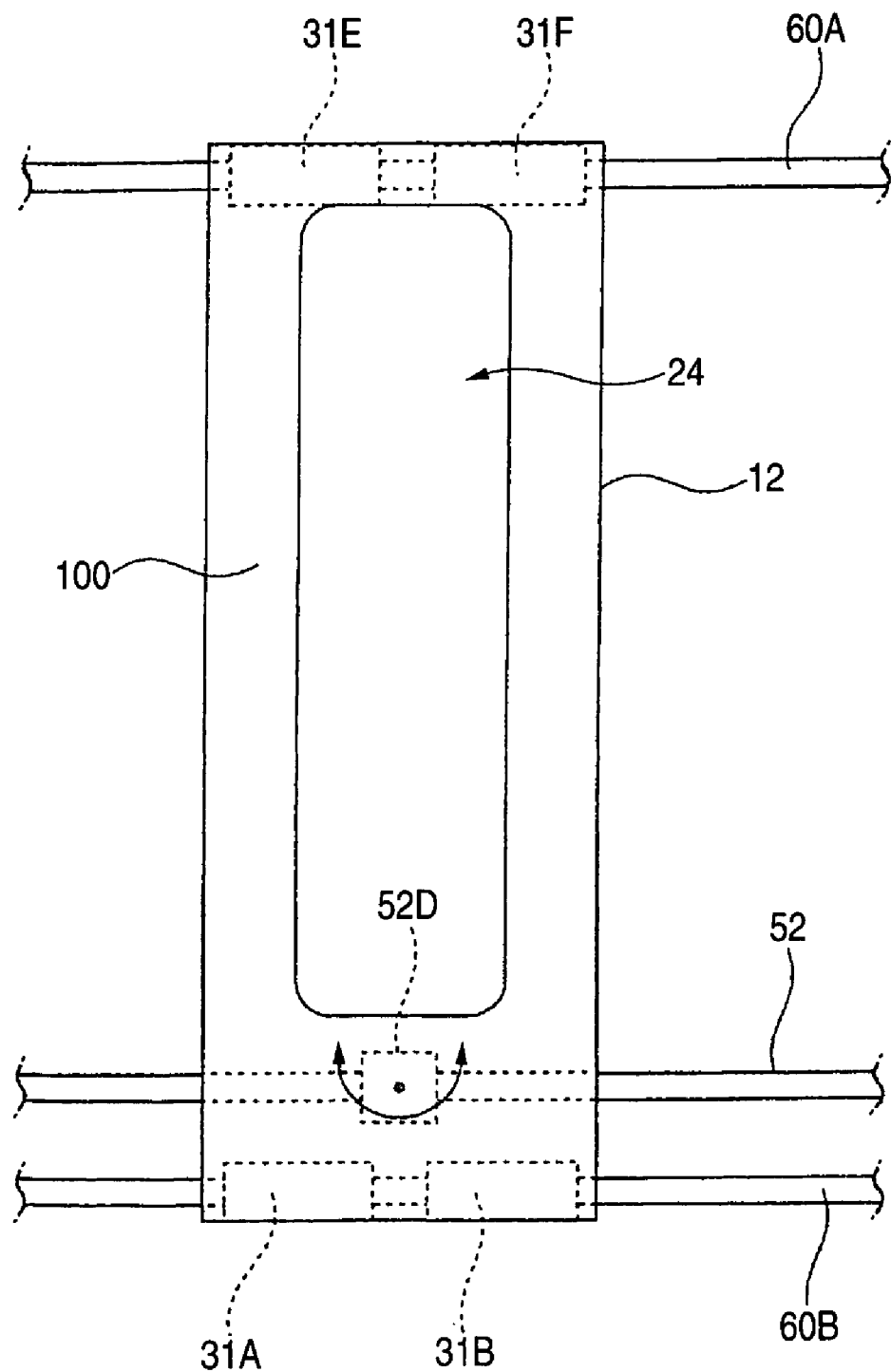
FIG. 2 is a diagrammatic view for describing a drawback of a related-art positioning apparatus.

The stage 30 of the positioning apparatus shown in FIG. 1 is characterized in that the micro-movement shaft, the work chuck, and the transfer mechanism, which are to be mounted on the stage, are arranged on the base-side (i.e., the lower side in the Z-axis direction) of the stage by way of the holes formed in the center of the stage in order to lower the overall height of the stage or the centroid of the same. In order to avoid interference with these mounted elements, the through holes 24 are formed in the intermediate stages (sliders) 12, 13. Drive elements, such as ball screws, and guide elements, such as linear guides, are provided at the end sections rather than at the center of the intermediate stages.

Figure 3:
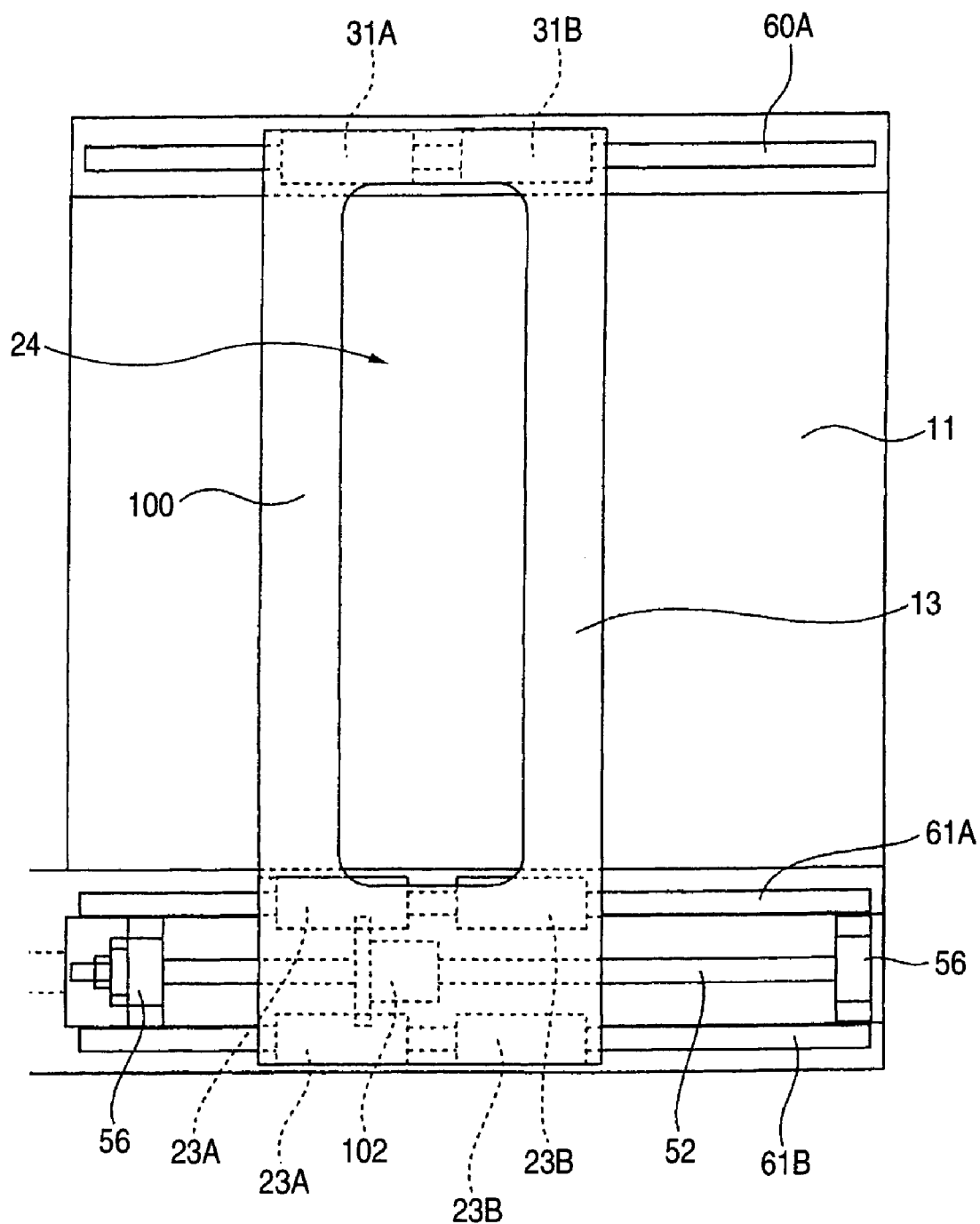
FIG. 3 is a plan view of the principal section of the positioning apparatus shown in FIG. 1.
Figure 4:
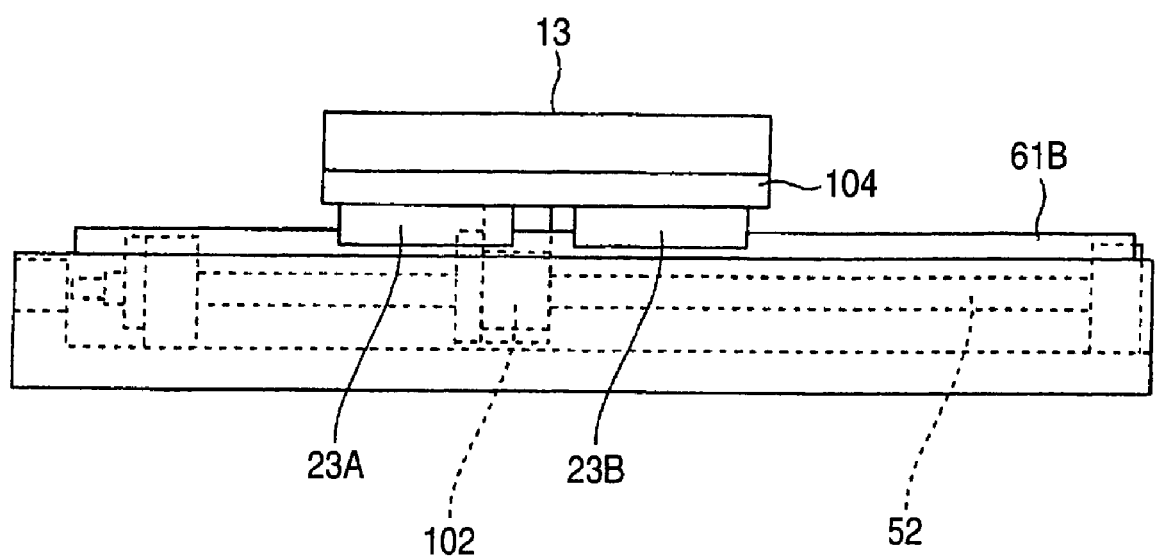
FIG. 4 is a side view of the positioning apparatus.

FIG. 3 is an enlarged plan view of the intermediate stage of the positioning apparatus. FIG. 4 is a side view of the intermediate stage. As mentioned previously, the two linear guide rails 61A, 61B are arranged in parallel with and close to each other with the ball screw shaft 52 interposed therebetween. Only one linear guide rail 60A is provided on the area of the base 11 opposite the area where the ball screw shaft 52 is provided. Reference numeral 102 designates the ball screw nut rotatively supported on the ball screw shaft. Reference numeral 104 designates a spacer.

In this configuration, the two linear guide rails 61A, 61B are provided in the area where the ball screw shaft 52 is placed. For this reason, the eigenvalue of the intermediate stage 13 in the yawing direction is increased, and hence the stiffness of the intermediate stage 13 in the yawing direction is increased.

By means of such a structure, the yawing stiffness of a related-art stage can be theoretically doubled, or improved by a factor of 1.4 in terms of an eigenvalue.

Under the assumption of provision of a plurality of pieces of positioning apparatus in which positions of the linear guides with respect to the intermediate stages are changed, the present inventor has analyzed the yawing stiffness of the stages of each positioning apparatus by means of a finite element method. The thus-analyzed eigenvalue assumes a value of, e.g., 155 Hz. When the eigenvalue is compared with a result (152.5 Hz) of experimental measurement of an actual machine whose specifications are taken as prerequisites for analysis, the values essentially coincide with each other. Therefore, it is understood that the stiffness of the stage can be analyzed accurately by means of finite element analysis.

Figure 5A:
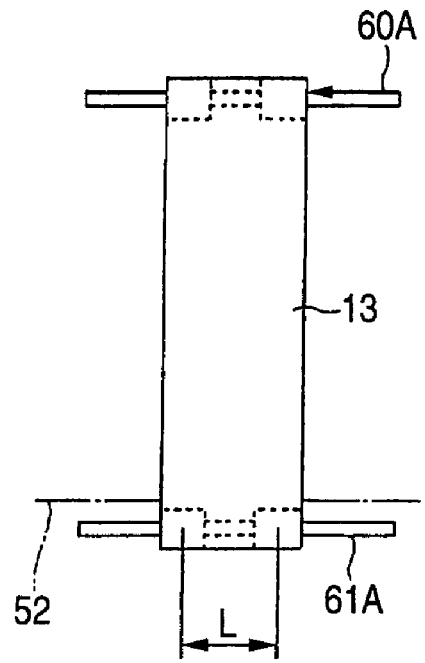
FIGS. 5A to 5D are plane diagrammatic views for describing a plurality of configurations for the principal section of conceived positioning apparatus in connection with analysis of the yawing stiffness of the stage by means of a finite element method.

FIGS. 5A to 5D are diagrammatic views of the principal features (i.e., the intermediate stage, the drive elements, and the guide elements) of a conceivable positioning apparatus in connection with the finite element analysis. FIG. 5A shows a related-art configuration, wherein one linear guide rail 61A is provided on the area of the positioning apparatus where the ball screw shaft 52 is provided, and the other linear guide rail 60A is provided in the area opposite the area where the ball screw shaft is provided.

Figure 5B:
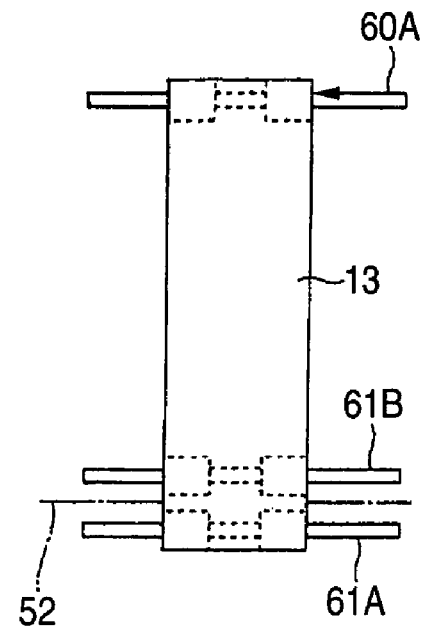
Figure 5C:
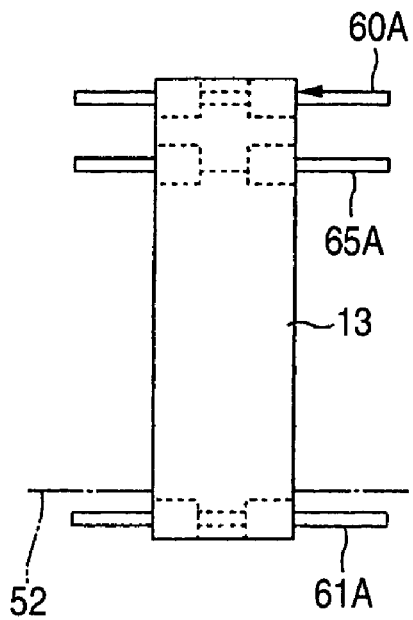

FIG. 5B shows a configuration to which the present invention is applied, wherein the two linear guide rails 61A, 61B are provided on the area of the positioning apparatus where the ball screw shaft 52 is placed. The configuration shown in FIG. 5D corresponds to a first comparative configuration example, wherein two linear guide rails 60A, 65A are provided on the area of the positioning apparatus opposite the area where the ball screw shaft 52 is provided. The configuration shown in FIG. 5D corresponds to a second comparative configuration example, wherein a pair of linear guide rails (60A, 65A) and another pair of linear guide rails (61A, 61B) are provided in the area of the positioning apparatus where the ball screw shaft 52 is placed and in the opposite area of the same.

In relation to the respective configurations, the stiffness ratio of the intermediate stage and an increase rate of eigenvalue are examined through use of the finite element method, whereby the configuration shown in FIG. 5B (i.e., the configuration of the present invention) is ascertained to be the most useful. FIG. 6 shows characteristics pertaining to the stiffness ratio and the increase rate. Examination of the stiffness ratio and the increase rate is performed on the assumption that the number of bearings of the linear guide is two, as indicated by broken lines shown in FIGS. 5A to 5D and that specifications of the linear guide rails and those of the bearings, the size of the intermediate stage, and a span L between the linear guide bearings (i.e., a distance between the centers of two linear guide bearings when the two linear guide bearings are provided on one linear guide rail; see FIG. 5A) are identical.

Here, the stiffness ratio is a ratio of stiffness of the intermediate stage to the yawing stiffness of each of the structures shown in FIGS. 5A to 5D. The stiffness of each of the configurations shown in FIGS. 5A to 5D is computed, given that the guide rails and the stage are modeled as rigid bodies; that the respective bearings are modeled as springs having no moment stiffness; and that points of load are modeled as positions in the respective configurations designated by arrows. A design value of the linear guide is applied to a spring constant.

The stiffness of the stage is computed by the finite element method while the bearing is modeled as elastic materials and the stage is modeled as an elastic substance. The stiffness is changed by means of changing the Young's modulus of material of the stage and performing computing operation for respective cases.

FIG. 6 has a region where the stiffness ratio exceeds 1. The reason for this is as follows. In contrast with a computation method in which bearings are replaced with a single spring, a plurality of spring elements are arranged over the entire length of the bearing of the linear guide when computation is performed by means of the finite element method. Therefore, the yawing stiffness computed by the finite element method becomes higher.

The rate of increase in the yawing eigenvalue of the stage is computed as follows. Provided that a yawing eigenvalue of the stage of the structure (i.e., the related-art structure) shown in FIG. 5A achieved when all the stages are made identical in terms of structure and material; that is, stiffness is made identical, is taken as $f_1$, a rate of increase in yawing eigenvalue (f) of the stages of the other configurations with respect to the yawing eigenvalue of the stage of the conventional structure is taken as an "increase rate: $(f-f_1)/f_1$."

In FIG. 6, reference symbol A denotes a characteristic of the configuration of the present invention shown in FIG. 5B. Reference symbol B denotes a characteristic of the configuration shown in FIG. 5C (having three linear guide rails, two guide rails being provided on the area opposite the area where the ball screw shaft is provided). Reference symbol C denotes a characteristic of the configuration shown in FIG. 5D, wherein the positioning apparatus has four linear guide rails, two linear guide rails being provided on the area where the ball screw shaft is provided and the other two being provided on the area opposite the area where the ball screw shaft is provided. Reference symbol D denotes a characteristic value achieved when the stiffness value of the configuration shown in FIG. 5B is multiplied by four-thirds. The characteristic value is computed, provided that the stiffness of the stage is multiplied by four-thirds when the number of linear guides is increased from three to four.

Figure 5D:
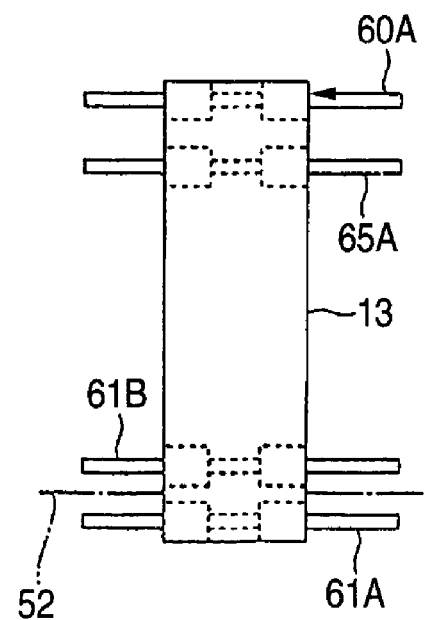

Reference symbol E denotes a characteristic achieved on the assumption that the stage is formed as a rigid material substance and that the stiffness of the stage becomes three-halves and that the stiffness of the stage is multiplied by three-halves (in contrast with the configuration shown in FIG. 5A) when the number of linear guides is increased from two to three. Reference symbol F denotes a characteristic achieved on the assumption that the stiffness of the stage is doubled when the stage of the configuration shown in FIG. 5D is taken as a rigid body (in contrast with the configuration shown in FIG. 5A) and when the number of linear guides is increased from two to four. As can be seen from the characteristic drawing, when the related-art configuration is provided with linear guide rails which are equal in number to those provided in the related-art configuration, the characteristic A of the structure having the linear guide added to the ball screw shaft is understood to obtain an eigenvalue higher than that achieved by the characteristic B of the structure having the additional linear guide provided in the area opposite the ball screw shaft and achieve improved yawing stiffness of the stage over the entire range of stiffness ratio.

Here, in the configuration in which the linear guide rails are added to the area opposite the area where the ball screw shaft is provided, when the linear guide rails are added to the area opposite the area where the ball screw shaft is placed at a stiffness ratio of 0.18 or less, the eigenvalue is decreased because of an increase in weight. As a result, when the stage is supported by three linear guides, the linear guides to be added are preferably provided on the area where the ball screw shaft is placed. Even in such a case, a decrease does not arise in the eigenvalue, which would otherwise be caused by addition of the linear guide rails.

Next, the characteristic (C) of the configuration having four linear guide rails and the characteristic (A) of the configuration having the linear guide rails provided on the area where the ball screw shaft is provided are examined through comparison. In the region where the stiffness ratio assumes a value of 0.29 or less, the characteristic A shows a higher rate of increase in eigenvalue than does the characteristic C. However, in the region where the stiffness ratio assumes a value of 0.29 or more, the characteristic C shows a higher rate of increase in eigenvalue than does the characteristic A, but the following problem arises.

The eigenvalue of the characteristic C is lower than that of the characteristic D. If the eigenvalue of the characteristic C is close to that of the characteristic D, further addition of one linear guide can be said to be significant. However, in the region where the stiffness ratio assumes a value of about 1 or less, the eigenvalue of the characteristic C is smaller than that of the characteristic E which is the theoretically maximum value achieved when three linear guides are provided.

In this region, an increase in the stiffness of the intermediate stages, such as an increase in the span L between the previously-described linear guide bearings, is more advantageous than addition of another linear guide rail on the area opposite the area where the drive element is provided, in view of cost-effectiveness. Moreover, in the region where the stiffness of the stage is small (i.e., the area where a small stiffness ratio is obtained), the configuration shown in FIG. 5B can enhance the eigenvalue to a greater extent than can addition of another linear guide rail on the area opposite the area where the drive element is provided.

The above embodiment has described a case where the invention is applied an X-Y stage. However, it goes without saying that the present invention can be applied to, e.g., uniaxial stages having the configurations shown in FIGS. 3 and 4. As a matter of course, the present invention can be used not only for a vacuum application, such as that mentioned in connection with the embodiment, but also for an atmospheric application. Further, the present invention is preferably applied to a stage which does not have any opening section but has low stiffness.

Although ball screws are used as drive elements, another element; e.g., a linear motor or a combination of belt and pulleys, can also be employed.

As is described above, according to the positioning apparatus of the invention, even when the stage has low yawing stiffness as in the case of a stage that has opening section, the yawing stiffness of the stage is enhanced by means of putting contrivance into the layout of guide elements. As a result, an advantage of the ability to accurately position a stage can be attained.

What is claimed is:

1. A positioning apparatus comprising:
    a base;
    guide elements provided directly on non-adjacent ends of the base; a slider which is guided by the guide elements; and
    a drive element provided directly at one of the non-adjacent ends of the base, wherein the drive element moves the slider along the guide elements, and
    wherein due to the configuration of the guide elements, a stiffness of the slider, in a yawing direction of the slider, in an area where the drive element is provided is made higher than that in an area opposite the area where the drive element is provided, wherein the configuration of the guide elements is such that the number of guide elements in the area where the drive element is provided is larger than the number of the guide elements in the area where the drive element is not provided.

2. The positioning apparatus according to claim 1, wherein:
    there are two guide elements provided on the base in the area where the drive element is provided.

3. The positioning apparatus according to claim 2, wherein:

the guide elements provided in the area of the base where the drive element is provided are arranged substantially symmetrically with respect to the drive element.

4. The positioning apparatus according to claim 1, wherein
the drive element is formed as a ball screw, and
the guide elements are formed as linear guides.

5. The positioning apparatus according to claim 1, wherein
the slider has an opening section.

6. An X-Y stage comprising:
the positioning apparatus defined in claim 1.

7. The X-Y stage according to claim 6, further comprising second guide elements provided directly on second non-adjacent ends of the base on which there are not provided said guide elements; a second slider which is guided by the second guide elements; and a second drive element provided directly at one of the second non-adjacent ends of the base and which moves the second slider along the second guide elements,
wherein, due to the configuration of the second guide elements, a stiffness of the second slider, in a yawing direction of the second slider, in an area where the second drive element is provided is made higher than that of an area of the second slider opposite to where the second drive element is provided.

8. The X-Y stage according to claim 7, wherein said second slider is arranged so as to move in a direction perpendicular to that in which said first slider is arranged to move.

9. The X-Y stage according to claim 6, wherein said base is fixed, and said slider moves relative to said base.

10. The positioning apparatus according to claim 1, wherein the guide elements are disposed in parallel to the ends of the base on which they are provided.

11. The positioning apparatus according to claim 1, wherein the drive element is not provided at the other one of the non-adjacent ends of the base.

12. The positioning apparatus according to claim 1, wherein the drive element and the guide elements are parallel to one another.

13. The positioning apparatus according to claim 1, wherein said base is fixed, and said slider moves relative to said base.

14. The positioning apparatus according to claim 1, wherein a stiffness of the guide element provided on the base in the area where the drive element is provided, is larger than a stiffness of the guide element provided on the base in an area opposite the area where the drive element is provided, so as to achieve said difference in stiffness.

15. The positioning apparatus according to claim 1, wherein each of the guide elements further comprises two linear guide bearings disposed on said slider, and further wherein an interval between the linear guide bearings provided in the area on which the drive element is provided, is greater than that between the linear guide bearings provided in the area opposite the area where the drive element is provided, so as to achieve said difference in stiffness.

16. A positioning apparatus comprising:
a base;
guide elements provided directly on non-adjacent ends of the base; a slider which is guided by the guide elements; and
a drive element provided directly at one of the non-adjacent ends of the base, wherein the drive element moves the slider along the guide elements, and
wherein due to an asymmetrical configuration of the guide elements, a stiffness of the slider, in a yawing direction of the slider, in an area where the drive element is provided is made higher than that in an area opposite the area where the drive element is provided, and
further wherein the size of the linear guide in the area where the drive element is provided is increased with respect to the size of the linear guide in the area where the drive element is not provided, so as to produce said asymmetrical configuration and said difference in stiffness.

17. A positioning apparatus comprising:
a base;
guide elements provided directly on non-adjacent ends of the base; a slider which is guided by the guide elements; and
a drive element provided directly at one of the non-adjacent ends of the base, wherein the drive element moves the slider along the guide elements, and
wherein due to an asymmetrical configuration of the guide elements, a stiffness of the slider, in a yawing direction of the slider, in an area where the drive element is provided is made higher than that in an area opposite the area where the drive element is provided,
wherein each of the guide elements further comprises two linear guide bearings disposed on said slider, and further wherein an interval between the linear guide bearings provided in the area on which the drive element is provided, is greater than that between the linear guide bearings provided in the area opposite the area where the drive element is provided, so as to produce said asymmetrical configuration and said difference in stiffness.

18. A positioning apparatus comprising:
a base;
guide elements provided directly on non-adjacent ends of the base; a slider which is guided by the guide elements; and
a drive element provided directly at one of the non-adjacent ends of the base, wherein the drive element moves the slider along the guide elements, and
wherein due to the configuration of the guide elements, a stiffness of the slider, in a yawing direction of the slider, in an area where the drive element is provided is made higher than that in an area opposite the area where the drive element is provided,
wherein the configuration of the guide elements is such that the number of guide elements in the area where the drive element is provided is larger than the number of the guide elements in the area where the drive element is not provided, and
further wherein the size of the linear guide in the area where the drive element is provided is increased with respect to the size of the linear guide in the area where the drive element is not provided, so as to contribute to said difference in stiffness.

19. A positioning apparatus comprising:
a base;
guide elements provided directly on non-adjacent ends of the base; a slider which is guided by the guide elements; and
a drive element provided directly at one of the non-adjacent ends of the base, wherein the drive element moves the slider along the guide elements, and
wherein due to the configuration of the guide elements, a stiffness of the slider, in a yawing direction of the slider, in an area where the drive element is provided is made higher than that in an area opposite the area where the drive element is provided, wherein the configuration of the guide elements is such that the number of guide elements in the area where the drive element is provided is larger than the number of the guide elements in the area where the drive element is not provided, wherein each of the guide elements further comprises two linear guide bearings disposed on said slider, and further wherein an interval between the linear guide bearings provided in the area on which the drive element is provided, is greater than that between the linear guide bearings provided in the area opposite the area where the drive element is provided, so as to contribute to said difference in stiffness.

20. A positioning apparatus comprising:

a base;

guide elements provided directly on non-adjacent ends of the base; a slider which is guided by the guide elements; and a drive element provided directly at one of the non-adjacent ends of the base, wherein the drive element moves the slider along the guide elements, wherein due to an asymmetrical configuration of the guide elements, a stiffness of the slider, in a yawing direction of the slider, in an area where the drive element is provided is made higher than that in an area opposite the area where the drive element is provided, wherein the size of the linear guide in the area where the drive element is provided is increased with respect to the size of the linear guide in the area where the drive element is not provided, so as to contribute to said asymmetrical configuration and to said difference in stiffness, and further wherein each of the guide elements further comprises two linear guide bearings disposed on said slider, and further wherein an interval between the linear guide bearings provided in the area on which the drive element is provided, is greater than that between the linear guide bearings provided in the area opposite the area where the drive element is provided, so as to contribute to said asymmetrical configuration and to said difference in stiffness.

21. A positioning apparatus comprising:

a base;

guide elements provided directly on non-adjacent ends of the base; a slider which is guided by the guide elements; and a drive element provided directly at one of the non-adjacent ends of the base, wherein the drive element moves the slider along the guide elements, and a means for producing a difference in stiffness in the slider such that a stiffness of the slider, in a yawing direction of the slider, in an area where the drive element is provided is made higher than that in an area opposite the area where the drive element is provided.

* * * * *